(12) United States Patent
Kinei et al.

(10) Patent No.: US 6,865,206 B2
(45) Date of Patent: Mar. 8, 2005

(54) SEMICONDUCTOR LASER DEVICE AND MANUFACTURING METHOD THEREFOR

(75) Inventors: Satofumi Kinei, Soraku-gun (JP); Takahiro Hashimoto, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 45 days.

(21) Appl. No.: 10/187,445

(22) Filed: Jul. 2, 2002

(65) Prior Publication Data

US 2003/0002553 A1 Jan. 2, 2003

(30) Foreign Application Priority Data

Jul. 2, 2001 (JP) .................................... 2001-200817
Jun. 4, 2002 (JP) .................................... 2002-162659

(51) Int. Cl.⁷ ............................................. H01S 5/00
(52) U.S. Cl. ...................................... 372/46; 372/43
(58) Field of Search ............................. 372/43–50, 54

(56) References Cited

U.S. PATENT DOCUMENTS

| | | | | |
|---|---|---|---|---|
| 5,227,015 A | * | 7/1993 | Fujihara et al. ............... | 438/40 |
| 5,270,246 A | * | 12/1993 | Mannou et al. ............... | 438/43 |
| 5,282,218 A | * | 1/1994 | Okajima et al. ............... | 372/46 |
| 5,675,601 A | * | 10/1997 | Karakida et al. ............... | 372/46 |
| 5,734,670 A | * | 3/1998 | Ono et al. ..................... | 372/45 |
| 5,932,004 A | | 8/1999 | Morimoto et al. ............. | 117/61 |
| 6,009,113 A | | 12/1999 | Morimoto et al. ............. | 372/46 |
| 6,044,099 A | * | 3/2000 | Shono et al. .................. | 372/46 |
| 6,147,364 A | * | 11/2000 | Itaya et al. .................... | 257/76 |
| 6,242,764 B1 | * | 6/2001 | Ohba et al. ................... | 257/190 |
| 6,333,946 B1 | * | 12/2001 | Miyashita et al. ............. | 372/46 |
| 6,470,039 B1 | * | 10/2002 | Ukita ........................... | 372/46 |

FOREIGN PATENT DOCUMENTS

| | | | | |
|---|---|---|---|---|
| JP | 07-074429 | | 3/1995 | |
| JP | 07074429 A | * | 3/1995 | ............. H01S/3/18 |
| JP | 03-195715 | | 8/2001 | |

* cited by examiner

*Primary Examiner*—Minsun Oh Harvey
*Assistant Examiner*—Phillip Nguyen
(74) *Attorney, Agent, or Firm*—Morrison & Foerster LLP

(57) ABSTRACT

There is provided a semiconductor laser device which is generally uniform in carrier concentration of a clad layer, almost free from strain, and less demanding for time and labor in its manufacturing, and which has stable characteristics. On an n-GaAs substrate, an n-type clad layer, an active layer, a p-type clad layer, and a cap layer are stacked one on another at a temperature of 700–750° C. Widthwise both side portions of the cap layer as well as widthwise both side specified-depth portions of the p-type clad layer are removed by etching to form a ridge portion, and a current constriction layer is formed on widthwise both sides of the ridge portion. A flattening layer having a planar surface is formed on the current constriction layer and the cap layer by slow cooling LPE process at a temperature of 700° C. or lower. On the flattening layer, a contact layer is formed by MOCVD process at a temperature of about 650° C.

6 Claims, 11 Drawing Sheets

SEMICONDUCTOR LASER DEVICE AND MANUFACTURING METHOD THEREFOR

BACKGROUND OF THE INVENTION

The present invention relates to a semiconductor laser device.

Conventionally, a semiconductor laser device as shown in FIG. 8 has been provided. This semiconductor laser device 100 has, on an n-GaAs substrate 101, an n-type clad layer 102 made of n-$Al_xGa_{1-x}As$ (x=0.5 or so), an active layer 103 made of $Al_xGa_{1-x}As$ (x=0.1 or so), a p-type clad layer 105 made of p-$Al_xGa_{1-x}As$ (x=0.5 or so) and having a ridge portion 104, a cap layer 106 placed on the ridge portion 104 and made of p-GaAs, a current constriction layer 110 positioned on widthwise both sides of the ridge portion 104 and on the p-type clad layer 105 and made of n-GaAs, and a p-GaAs contact layer 112. The contact layer 112 is formed with a thickness of about 50 µm, where the thickness from the lower end of the substrate 101 to the active layer 103 and the thickness from the upper end of the contact layer 112 to the active layer 103 are made generally equal to each other and smaller than 60 µm.

This laser device 100 is used as a light source in such an optical pickup of an optical disk system as shown in FIG. 9A. A laser beam emitted from a widthwise central portion of the active layer 103 of the semiconductor laser device is split into a main beam and a sub-beam by a diffraction grating 121, which are then reflected by a half mirror 123 and converged to an optical disk 125 by an objective lens 124. A laser beam reflected by the optical disk 125, passing through the objective lens 124 and through the half mirror 123, is received by an unshown photodetector and thereby converted to a reproduced signal. Part of the laser beam reflected by the optical disk 125, especially the sub-beam is reflected by the half mirror 123, returning through the diffraction grating 121 to the semiconductor laser device 100. This return beam returning to the semiconductor laser device 100 comes incident at positions away from the active layer 103 of the semiconductor laser device by about 60 µm on thicknesswise both sides of the semiconductor laser device. This semiconductor laser device is so made that the thickness from the lower end of the substrate 101 to the active layer 103 and the thickness from the upper end of the contact layer 112 to the active layer 103 become generally equal to each other and smaller than 60 µm. Therefore, of the return beam, only part of the return beam lower than the active layer 103 in FIG. 9A comes incident on an end face portion A of a stem 126 on which the semiconductor laser device 100 is mounted. With this arrangement, the return beam is prevented from coming incident on both the end face portion A of the stem 126 and an end face portion B of the semiconductor laser device, as in an optical pickup including such a semiconductor laser device 200 in which an active layer 203 is formed so as to be decentered toward the thicknesswise lower side as shown in FIG. 9B. Thus, the optical pickup of FIG. 9A is made smaller in return-beam reflection amount than the optical pickup of FIG. 9B, so that read signals derived from the return beam reaching again the optical disk and detected by the photodetector undergo less deterioration in S/N (Signal-to-Noise) ratio.

The semiconductor laser device 100 is manufactured in the following processes. As shown in FIG. 10A, on an n-GaAs substrate 101, an n-type clad layer 102, an active layer 103, a p-type clad layer 105, and a cap layer 106 are stacked one on another by MOCVD (Metal Organic Chemical Vapor Deposition) process at a temperature of 700–750° C. Then, widthwise both side portions of the cap layer 106 as well as widthwise both side specified-depth portions of the p-type clad layer 105 measured from its top surface are removed to form a ridge portion 104, and further an n-GaAs layer 107 is grown on the cap layer 106 and the p-type clad layer 105 by MOCVD process (FIG. 10B). In the n-GaAs layer 107, during its growth by the MOCVD process, n-GaAs is grown into a configuration corresponding to the configuration of the surface that is subjected to growth, so that a protruding portion 108 protruding from widthwise both side portions at a widthwise central portion of the n-GaAs layer 107 positioned above the ridge portion 104 is formed. With a resist mask 109 set on widthwise both sides of this protruding portion 108 of the n-GaAs layer (FIG. 10C), the protruding portion 108 of the n-GaAs layer is removed by etching, and then the resist mask 109 is removed, by which a current constriction layer 110 such as shown in FIG. 10D is formed on widthwise both sides of the ridge portion 104. Subsequently, p-GaAs is grown on the current constriction layer 110 and on the cap layer 106 by slow cooling LPE (Liquid Phase Epitaxial) process, by which a contact layer 112 is formed. Thus, the semiconductor laser device 100 is completed (FIG. 8). During the formation of the contact layer 112 by the slow cooling LPE process, the growth temperature is controlled to a highest of about 800° C. so that a relatively thick contact layer having a thickness of 50 µm is formed reliably.

In another manufacturing method of the semiconductor laser device 100, p-GaAs is grown on the current constriction layer 110 and the cap layer 106 by MOCVD process to form the contact layer 112.

A further method using the slow cooling LPE process for manufacturing the semiconductor laser device is available, the method including the steps of forming a first clad layer, an active layer and a lower-side second clad layer on a semiconductor substrate, forming thereon a current constriction layer having a striped groove, and forming an upper-side second clad layer on this current constriction layer by the slow cooling LPE process. In this semiconductor device manufacturing method, the upper-side second clad layer is formed by filling the groove of the current constriction layer by slow cooling LPE process.

However, in the semiconductor laser device 100, in which the contact layer 112 is formed by slow cooling LPE process, since the highest of growth temperatures for the contact layer 112 is about 800° C., dopants of the n-type clad layer 102 and the p-type clad layer 105 diffuse due to the highest temperature, causing the carrier concentration distribution to change as a problem. Further, dopants of the n-type clad layer 102 and the p-type clad layer 105 diffuse so as to reach the active layer, deteriorating the light-emitting characteristics of the active layer and, as a result, degrading the reliability of the semiconductor laser device as another problem.

In order to suppress the diffusion of the dopants of the n-type clad layer 102 and the p-type clad layer 105, it is conceivable to set the growth temperature of the contact layer 112 to around 700° C. However, with growth temperatures around 700° C., it would be impossible to achieve a growth of the contact layer 112 to a thickness of 50 µm by slow cooling LPE process.

There is a further problem that the contact layer 112 formed by the slow cooling LPE process would result in a carrier concentration that decreases along a direction from lower end toward upper end as viewed in FIG. 8 of the contact layer 112. This is due to the fact that since the slow cooling LPE process causes the growth temperature to lower with an elapse of the growth time, the amount of dopant deposition onto the contact layer 112 decreases with the lowering of the growth temperature. Particularly, at surface portions of the p-GaAs layer grown to form the contact layer 112, carrier concentration decreases considerably as shown in a carrier distribution chart of FIG. 11. In FIG. 11, the horizontal axis represents the thicknesswise distance ($\mu$m) from the surface of the p-GaAs layer, and the vertical axis represents the carrier concentration (pcs/cm$^3$). Accordingly, it has been the case that after the growth of p-GaAs, an upper end portion of the p-GaAs growth layer is removed, by which the contact layer 112 is formed. This would result in an increase in the manufacturing process of the semiconductor laser device, which has been a cause of increases in the labor and cost for the manufacture.

There is yet further problem that in the semiconductor laser device 100, in which the contact layer 112 is formed by MOCVD process, since the surfaces of the current constriction layer 110 and the cap layer 106, on which the contact layer 112 is to be grown, have depressions or projections as shown in FIG. 10D, the contact layer 112 formed on the surfaces having these depressions or projections by the MOCVD process is subject to occurrence of strain. FIG. 8 shows a result of observing by photoelastic approach the strain of the semiconductor laser device 100, in which the contact layer 112 has been formed by MOCVD process, in an overlapped view. As shown in FIG. 8, the strain due to the formation of the contact layer 112 on the depressed-and-projecting surfaces by MOCVD process has occurred to not only a widthwise central portion C of the contact layer 112 but also a widthwise central portion D of the n-type clad layer 102 and the substrate 101. The strain that has occurred to the widthwise central portion C of the contact layer 112 and the widthwise central portion D of the n-type clad layer 102 and the substrate 101 would adversely affect the light-emitting region, which is widthwise central portion of the active layer 103, causing a deterioration in the light-emitting characteristics of the semiconductor laser device. This problem is further noticeable with high-output laser devices in which the ridge portion of the p-type clad layer is formed relatively large in height. This is because large height of the ridge portion would increase the depressions and projections of the surfaces of the cap layer and the current constriction layer, which are to be formed on this ridge portion.

Furthermore, in the case where the groove of the current constriction layer is filled with part of the upper-side second clad layer by the slow cooling LPE process, there is a disadvantage as described below. That is, in the slow cooling LPE process, depending on the magnitude of supersaturation $\Delta t$ of the LPE growth solution, the state in which part of the contact layer is filled into the groove of the current constriction layer varies as shown in FIGS. 12A, 12B and 12C. In FIGS. 12A, 12B and 12C, reference numeral 156 denotes a current constriction layer, and 158 denotes an upper-side second clad layer. The terms, supersaturation $\Delta t$ of the LPE growth solution, refer to a difference between a saturation temperature at the time when p-type dopants such as GaAs, Al or Mg as a solute are melted into, for example, Ga as a solvent, and a supersaturation temperature at the time when the growth is started on the wafer with the temperature lowered from the saturation temperature. Preferably, the upper-side second clad layer 158 is formed so as to form a planar surface on the groove of the current constriction layer 156 and on the current constriction layer 156 as shown in FIG. 12B. However, the slow cooling LPE process is liable to variations in supersaturation $\Delta t$ of the LPE growth solution at the plane of the wafer. As a result, growth defects would occur partly within the wafer plane according to the variations in supersaturation $\Delta t$ as shown in FIGS. 12A and 12C.

SUMMARY OF THE INVENTION

Therefore, an object of the present invention is to provide a semiconductor laser device which is generally uniform in carrier concentration of the clad layer, almost free from strain, and less demanding for time and labor in its manufacturing, and which has stable characteristics.

In order to achieve the above object, the present invention provides a semiconductor laser device which comprises, on a semiconductor substrate, a first clad layer, an active layer, a second clad layer having a ridge portion, a current constriction layer positioned on the second clad layer and on both sides of the ridge portion, and a contact layer, where the contact layer is formed by vapor phase epitaxial process, the semiconductor laser device further comprising:

a strain-occurrence preventing structure for preventing any strain from occurring in the contact layer.

With the semiconductor laser device of the above constitution, since occurrence of strain in the contact layer is prevented by the strain-occurrence preventing structure, deteriorations in the light-emitting characteristics of the semiconductor laser device due to strain of the contact layer, as would occur in the prior art, can be prevented so that a semiconductor laser device having successful light-emitting characteristics is obtained.

In one embodiment, the strain-occurrence preventing structure is a flattening layer formed between the current constriction layer as well as the ridge portion of the second clad layer, and the contact layer, by liquid phase epitaxial process.

With the semiconductor laser device of this embodiment, since the flattening layer formed by liquid phase epitaxial process is provided between the current constriction layer plus the ridge portion of the second clad layer and the contact layer, the flattening layer having its surface formed planar by liquid phase epitaxial process, the contact layer formed on this planar surface can be made almost free from strain.

In one embodiment, the ridge portion of the second clad layer has a height of 1.2 $\mu$m or more.

With the semiconductor laser device of this embodiment, even though the ridge portion of the second clad layer has a height of 1.2 $\mu$m or more, a contact layer free from strain can be obtained by virtue of the provision of the strain-occurrence preventing structure.

In one embodiment, the flattening layer is formed by temperature-difference liquid phase epitaxial process.

With the semiconductor laser device of this embodiment, since the flattening layer serving as the strain-occurrence preventing structure is formed by temperature-difference liquid phase epitaxial process, the surface of the flattening layer is formed planar effectively. As a result, the contact layer can be prevented from strain effectively.

Also, the present invention provides a method for manufacturing a semiconductor laser device, comprising the steps of:

forming a first clad layer, an active layer, a second clad layer one on another on a semiconductor substrate;

forming a ridge portion in the second clad layer;

forming a current constriction layer on the second clad layer and on both sides of the ridge portion;

forming a flattening layer on the ridge portion of the second clad layer and on the current constriction layer by liquid phase epitaxial process; and forming a contact layer on the flattening layer by vapor phase epitaxial process.

With the semiconductor laser device manufacturing method of this constitution, on the semiconductor substrate, the first clad layer, the active layer and the second clad layer are formed, the ridge portion is formed in this second clad layer, and the current constriction layer is formed on the second clad layer and on both sides of the ridge portion. The flattening layer is formed on the ridge portion of the second clad layer and on the current constriction layer by liquid phase epitaxial process. On this flattening layer, the contact layer is grown by vapor phase epitaxial process. Thus, with the manufacturing method of this invention, the contact layer can be formed without causing strain. As a result, a semiconductor laser device having successful light-emitting characteristics can be obtained.

In one embodiment, the flattening layer is formed at a temperature lower than any one of temperatures for forming the first clad layer, the active layer, the second clad layer and the current constriction layer.

With the semiconductor laser device manufacturing method of this embodiment, since the flattening layer is formed at a temperature lower than any one of temperatures for forming the first clad layer, the active layer, the second clad layer and the current constriction layer, dopants with which the first clad layer and the second clad layer have been doped can be prevented from diffusing and reaching the active layer during the formation of the flattening layer. As a result, a semiconductor laser device having successful characteristics can be obtained.

Also, the present invention provides a semiconductor laser device which comprises, on a semiconductor substrate, a first clad layer, an active layer, a lower-side second clad layer, a current constriction layer positioned on both sides of the lower-side second clad layer, an upper-side second clad layer positioned on the lower-side second clad layer and the current constriction layer, and a contact layer, wherein the upper-side second clad layer is formed by temperature-difference liquid phase epitaxial process.

With the semiconductor laser device of this constitution, during the formation of the upper-side second clad layer by the temperature-difference LPE process, portions different in temperature to each other are formed on the lower-side second clad layer and on the current constriction layer, where a temperature difference in the planar direction is given, so that the growth state of crystals constituting the upper-side second clad layer can be controlled. Therefore, the crystals constituting the upper-side second clad layer are properly formed on the lower-side second clad layer between the current constriction layers. As a result, a disadvantage that growth defects of the upper-side second clad layer would occur due to variations in supersaturation Δt of growth solutions, as in the conventional case using the slow cooling LPE process, can be avoided. Besides, the surface of the upper-side second clad layer can be formed planar.

The invention of this constitution is now described in more detail. For example, for the processes of filling the clad layer into the striped groove formed in the current constriction layer to obtain planar-formed portions in the surface of the clad layer above the striped groove, it is advantageous in terms of manufacturing cost to employ liquid phase epitaxial process according to growth conditions (supersaturation Δt for slow cooling LPE). Among some types of liquid phase epitaxial process, adopting temperature-difference LPE process reduces partial growth defects within the wafer surface due to variations in supersaturation Δt in solutions, as would be involved in the slow cooling LPE process. The reason of this is as follows. That is, in the temperature-difference LPE process, for example, a solution using Ga as a solvent is given a temperature difference between upper part and lower part, and GaAs, which is the solute of the solution and the material crystals of the clad layer, is placed at the upper part (high-temperature side) of the solution while the wafer is placed at the lower part (low-temperature side) of the solution. As a result of this, the crystal material diffuses into the solution, and the diffused crystal material is epitaxially grown on the wafer. Just under the wafer is given a flow of a cooling medium such as gas so that heat absorption is implemented on the low-temperature side (wafer side), by which a temperature difference in the solution is given effectively. In this connection, the growth state of the crystal material on the wafer varies depending on the temperature difference in the solution. Therefore, the part just under the wafer is segmented, and the cooling medium to be put into flow is made controllable in amount on the basis of the resulting sections, so that the temperature difference in the solution with which the wafer is to make contact can be varied within the wafer surface. As a consequence, the crystal growth state at the striped groove part of the wafer can be made different from the other part, thus it becoming possible to properly control the state in which the crystals are filled into the striped groove.

In one embodiment, the contact layer has a thickness of not less than 10 μm and not more than 60 μm.

With the semiconductor laser device of this embodiment, by virtue of the contact layer having a thickness of not less than 10 μm, a semiconductor laser device having a relatively large strength can be obtained. Besides, by virtue of the contact layer having a thickness of not more than 60 μm, in the case where the semiconductor laser device is used as a light source in an optical pickup of an optical disk system as an example, the return beam derived from the optical disk does not come incident on the end faces of the semiconductor laser device so that the return beam can be prevented from being applied again to the optical disk. Thus, an optical pickup having relatively successful S/N ratios of read signals can be obtained.

Furthermore, the present invention provides a method for manufacturing a semiconductor laser device, comprising the steps of:

forming a first clad layer, an active layer, a lower-side second clad layer and a current constriction layer on a semiconductor substrate;

forming a striped groove in the current constriction layer;

forming an upper-side second clad layer on the lower-side second clad layer and on the current constriction layer by temperature-difference liquid phase epitaxial process; and forming a contact layer on the upper-side second clad layer by temperature-difference liquid phase epitaxial process.

With the semiconductor laser device manufacturing method of this constitution, on the semiconductor substrate, the first clad layer, the active layer, the lower-side second clad layer and the current constriction layer are formed, and the striped groove is formed in this current constriction layer. The upper-side second clad layer is formed on the current constriction layer so as to form a generally planar surface by temperature-difference LPE process in such a manner that the striped groove is filled. On this upper-side second clad layer, the contact layer is formed by temperature-difference LPE process. Accordingly, it is no longer necessary to eliminate upper end portions of growth layers in the process of forming the contact layer, which would be involved in the prior art, so that manufacturing labor and cost for the semiconductor laser device can be reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

Figure 1:
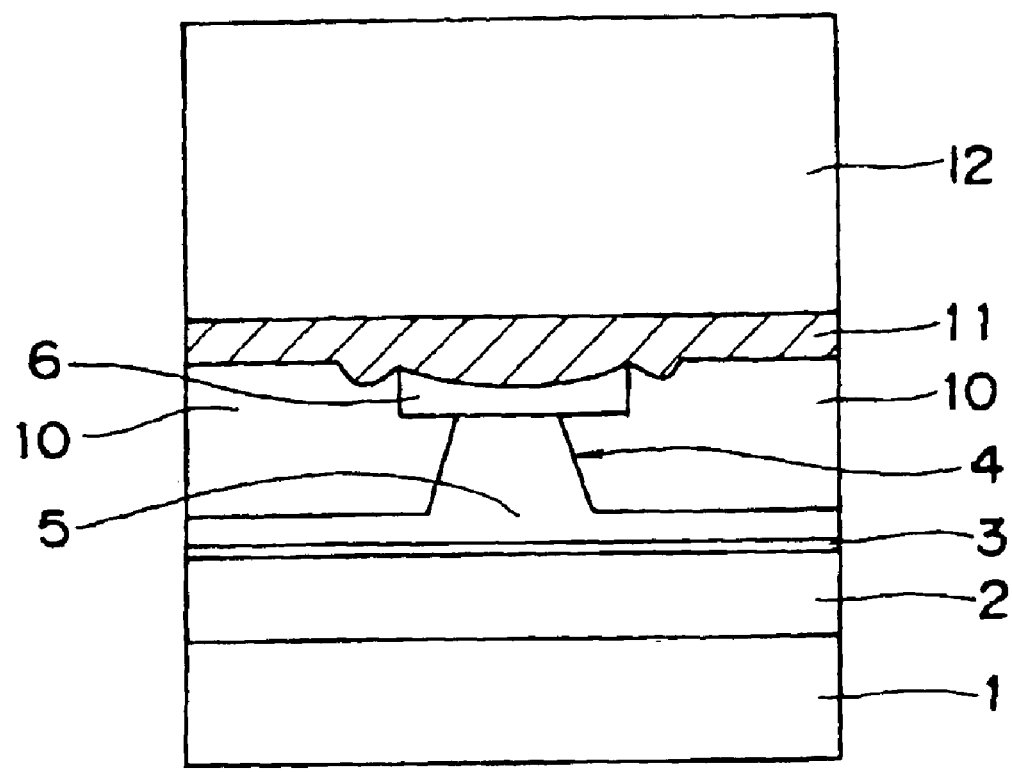
FIG. 1 is a view showing a semiconductor laser device according to a first embodiment of the present invention.

FIG. 1 is a view showing a semiconductor laser device according to a first embodiment of the present invention. This semiconductor laser device has, on an n-GaAs substrate 1 as a semiconductor substrate, an n-type clad layer 2 as a first clad layer made of n-$Al_{0.5}Ga_{0.5}As$, an active layer 3 made of non-doped $Al_{0.1}Ga_{0.9}As$, a p-type clad layer 5 as a second clad layer made of p-$Al_{0.5}Ga_{0.5}As$ and having a ridge portion 4, a cap layer 6 placed on the ridge portion and made of p-GaAs, a current constriction layer 10 positioned on widthwise both sides of the ridge portion 4 and on the p-type clad layer 5 and made of n-GaAs, a flattening layer 11 formed on the cap layer 6 and the current constriction layer 10 and made of p-GaAs, and a p-GaAs contact layer 12 formed on the flattening layer 11. The ridge portion 4 of the p-type clad layer 5 has a height of about 1.2 $\mu$m, the flattening layer 11 has a thickness of 0.5 to 1.0 $\mu$m, and the contact layer 12 has a thickness of about 50 $\mu$m. The thickness from the lower end of the substrate 1 to the active layer 3 and the thickness from the upper end of the contact layer 12 to the active layer 103 are made generally equal to each other and smaller than 60 $\mu$m.

Figure 2A:
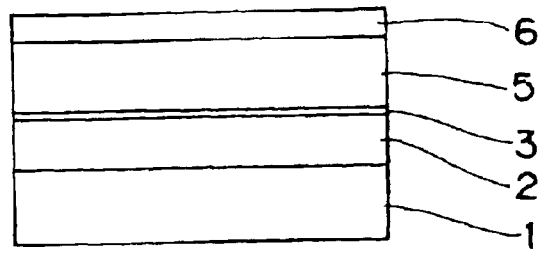
FIGS. 2A, 2B, 2C, 2D and 2E are views showing processes for fabricating the semiconductor laser device.
Figure 2B:
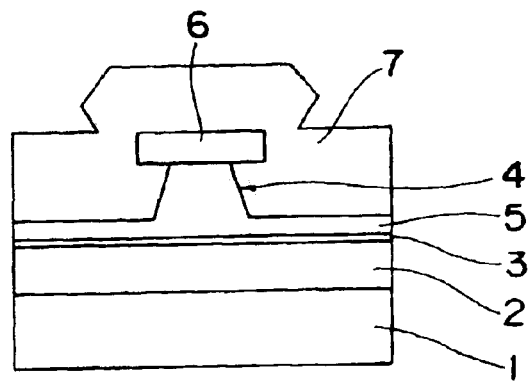
Figure 2C:
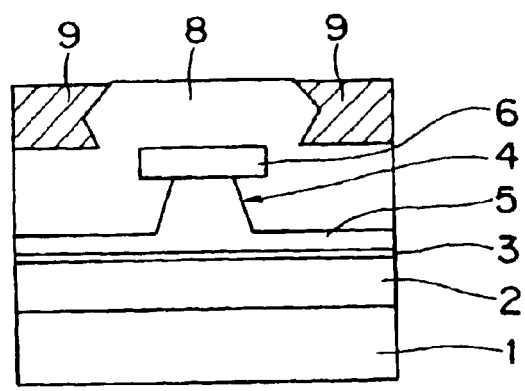
Figure 2D:
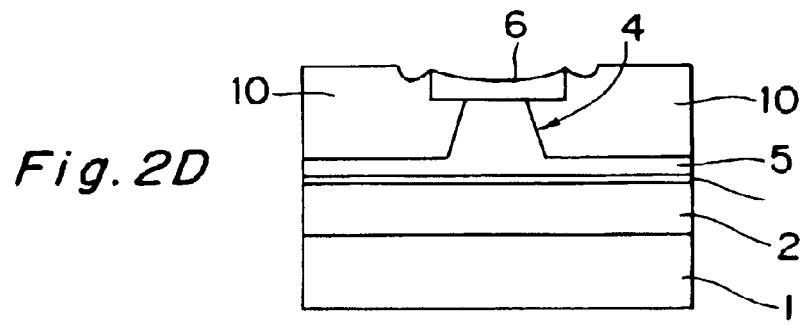
Figure 2E:
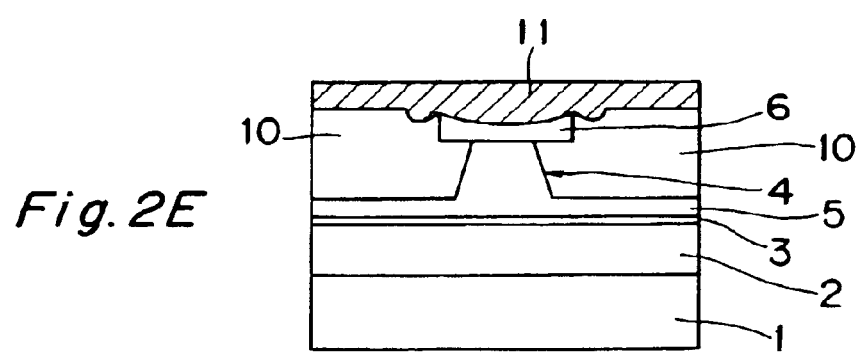

This semiconductor laser device 1 is manufactured in the following processes. As shown in FIG. 2A, on an n-GaAs substrate 1, an n-type clad layer 2, an active layer 3, a p-type clad layer 5, and a cap layer 6 are stacked one on another by MOCVD process as a chemical vapor phase deposition process at a temperature of 700–750° C. Then, a striped resist mask not shown in FIG. 2A is formed by photolithography on top of the cap layer 6. Subsequently, widthwise both side portions of the cap layer 6 as well as widthwise both side specified-depth portions of the p-type clad layer 5 are removed by etching with ammonia-base and sulfuric-acid-base etchants to form a ridge portion 4 in the p-type clad layer 5. Thereafter, with the resist mask removed, an n-GaAs layer 7 is grown on the cap layer 6 and the p-type clad layer 5 by MOCVD process (FIG. 2B). With the resist mask 9 placed on widthwise both sides of the protruding portion 8 formed at a widthwise center of the n-GaAs layer 7 (FIG. 2C), the protruding portion 8 of the n-GaAs layer 7 is removed by etching. Thereafter, the resist mask 9 is removed to form current constriction layers 10, 10 such as shown in FIG. 2D on widthwise both sides of the ridge portion 4. In this process, as a result of etching, depressions and projections occur to the surface of the cap layer 6 and part of the surface of the current constriction layer 10 as shown in FIG. 2D. Therefore, p-GaAs is grown to a thickness of 0.5 to 1.0 $\mu$m on the current constriction layer 10 and the cap layer 6 by slow cooling LPE (Liquid Phase Epitaxial) process to form a flattening layer 11 having a planar surface (FIG. 2E). In the process of forming this flattening layer 11, since the growth thickness of p-GaAs is 0.5 to 1.0 $\mu$m, i.e. relatively thin, the temperature at which the slow cooling LPE process is carried out may be 700° C. or lower. On the flattening layer 11 formed with its surface planar, p-GaAs is grown to about 50 $\mu$m by MOCVD process to form a contact layer 12, as shown in FIG. 1. Thus, the semiconductor laser device shown in FIG. 1 is obtained. The growth of p-GaAs for the contact layer 12 by the MOCVD process is carried out at a temperature of about 650° C.

In the semiconductor laser device manufactured in this way, since the contact layer 12 is formed on the flattening layer 11 having a planar surface, there occurs no strain in spite of the fact that the contact layer 12 is formed by MOCVD process. As a result, strain in the contact layer and the substrate due to the formation of the contact layer by MOCVD process on a surface having depressions and projections as in the prior art can be prevented effectively, so that a semiconductor laser device having successful light-emitting characteristics can be obtained.

Also, the flattening layer 11 is formed at a temperature of 700° C. or lower and the contact layer 12 is formed at a temperature of about 650° C., where these temperatures are lower than the temperature of 700 to 750° C. for the formation of the n-type clad layer 2, the active layer 3, the p-type clad layer 5 and the cap layer 6. As a result, during the process of forming the flattening layer 11 and the contact layer 12, it never occurs that the dopants of the n-type clad layer and the p-type clad layer diffuse so as to reach the active layer as would occur in the prior art. Therefore, the semiconductor laser device having successful light-emitting characteristics can be obtained stably.

Also, in the semiconductor laser device, the thickness from the lower end of the substrate 1 to the active layer 3 and the thickness from the upper end of the contact layer 12 to the active layer 3 are made generally equal to each other and smaller than 60 μm. Accordingly, in this semiconductor laser device, when it is used as a light source of an optical pickup, a return beam having returned to the semiconductor laser device from the optical disk does not come incident on the end face. As a result, the return beam is reflected by the end face of the semiconductor laser device to reach again the optical disk, so that decreases in the S/N ratio of signals to be read by the optical pickup can be prevented effectively. Besides, since the contact layer of this semiconductor laser device is 10 μm or more thick, the semiconductor laser device can be made relatively large in strength.

The current constriction layer 10, which is made of n-GaAs in this embodiment, may also be formed of n-$Al_{0.5}Ga_{0.5}As$.

The contact layer 12, which is formed by MOCVD process in this embodiment, may also be formed by temperature-difference LPE process. In this case, the contact layer 12 may appropriately be formed so that the temperatures at the n-type clad layer 2, the active layer 3, the p-type clad layer 5 and the cap layer 6 become lower than 700 to 750° C.

Figure 3:
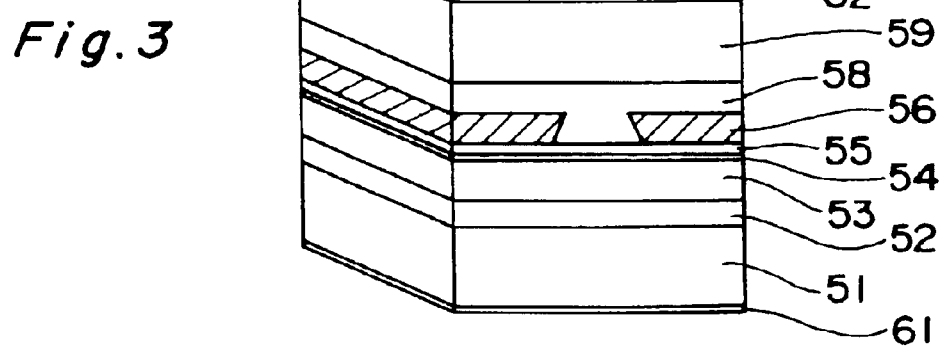
FIG. 3 is a view showing a semiconductor laser device according to a second embodiment of the invention.

FIG. 3 is a view showing a semiconductor laser device according to a second embodiment of the invention. This semiconductor laser device has, on an n-GaAs substrate 51 as a semiconductor substrate, an n-type buffer layer 52, an n-type clad layer 53 as a first clad layer made of n-$Al_{0.5}Ga_{0.5}As$, an active layer 54 made of $Al_{0.13}Ga_{0.87}As$, and a lower-side p-type clad layer 55 as a lower-side second clad layer made of p-$Al_{0.5}Ga_{0.5}As$, in this order, where a current constriction layer 56 made of n-GaAs is formed on widthwise both sides on the lower-side p-type clad layer 55. On this current constriction layer 56 and on the lower-side p-type clad layer 55, an upper-side p-type clad layer 58 as an upper-side second clad layer made of p-$Al_{0.5}Ga_{0.5}As$ is formed, and a contact layer 59 made of p-GaAs is formed thereon. Electrodes 61, 62 made of Au—Ge are provided on the lower side face of the substrate 51 and on the upper side face of the contact layer 59, respectively.

Figure 4A:
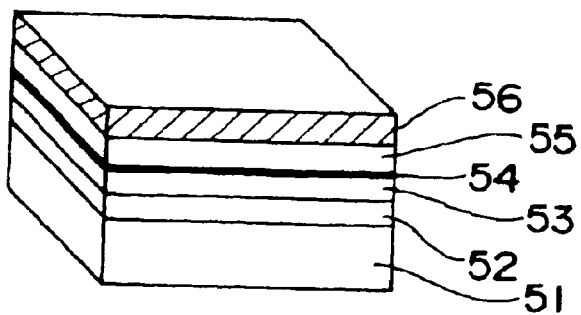
FIGS. 4A, 4B and 4C are views showing processes for fabricating the semiconductor laser device.
Figure 4B:
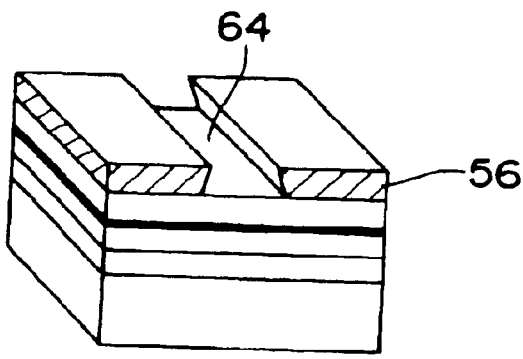
Figure 4C:
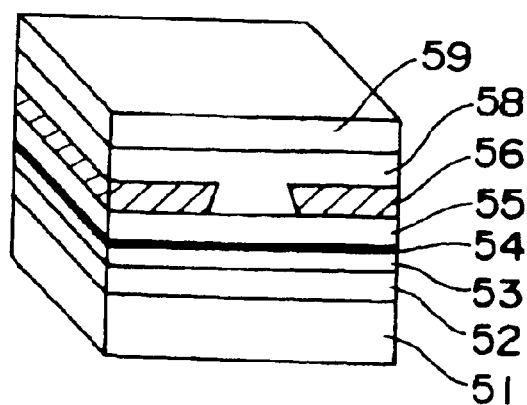

This semiconductor laser device is manufactured in the following processes. First, as shown in FIG. 4A, on an n-GaAs substrate 51, a 0.5 μm thick n-type buffer layer 52, a 1.0 μm thick n-type clad layer 53, a 0.08 μm thick active layer 54, a 0.35 μm thick lower-side p-type clad layer 55, and a 1.0 μm thick current constriction layer 56 are grown one on another by MOCVD process. Subsequently, a widthwise center of the current constriction layer 56 is removed by etching to form a striped groove 64. This striped groove 64 is set to a width of 4 μm at the upper side face (FIG. 4B). Subsequently, the striped groove 64 is filled with p-$Al_{0.5}Ga_{0.5}As$ by temperature-difference LPE process, and further p-$Al_{0.5}Ga_{0.5}As$ is stacked on the current constriction layer 56 to form an upper-side p-type clad layer 58. This upper-side p-type clad layer 58 is made to have a thickness of 1.0 μm on the current constriction layer 56. Subsequently, a contact layer 59 is formed by temperature-difference LPE process (FIG. 4C). Finally, a p-electrode 62 and an n-electrode 61 of, for example, Au—Ge, AuZn or the like are formed on the upper side face of the contact layer 59 and the lower side face of the n-GaAs substrate 51 (FIG. 3). Thus, the semiconductor laser device is completed.

Figure 5A:
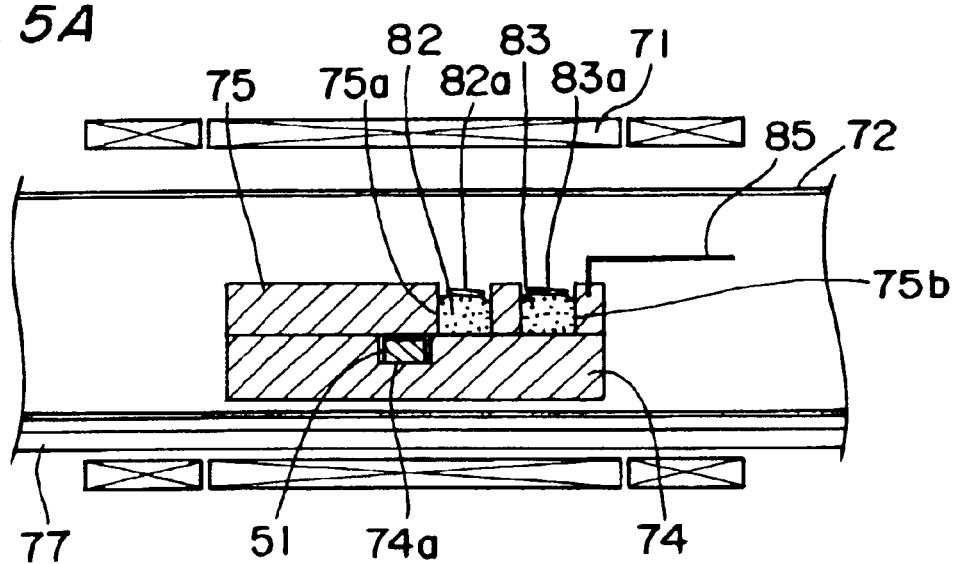
FIGS. 5A, 5B and 5C are views showing processes for forming a p-type clad layer and a contact layer by a temperature-difference LPE process.
Figure 5B:
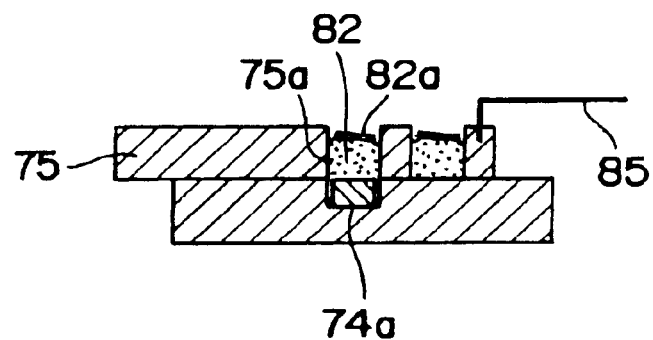
Figure 5C:
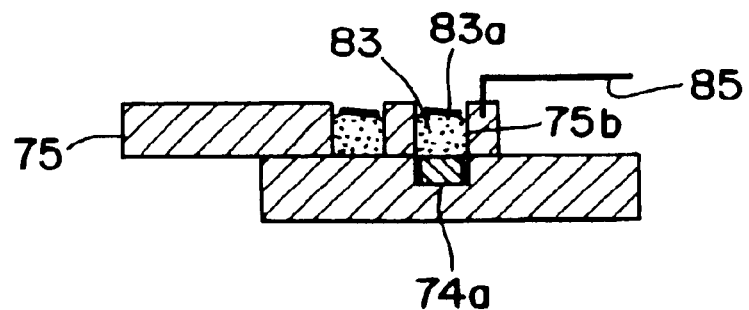
Figure 6:
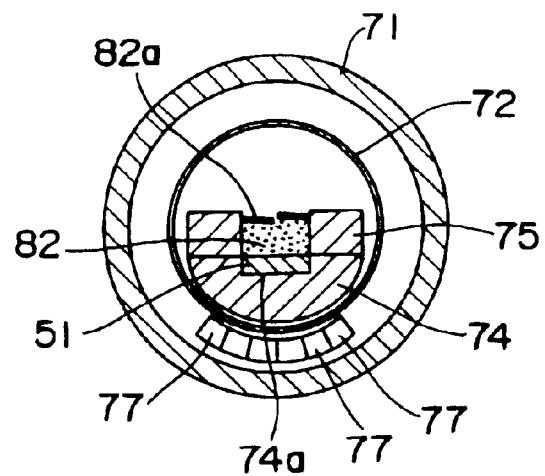
FIG. 6 is a sectional view showing an equipment with which the temperature-difference LPE process is performed.

FIGS. 5A, 5B and 5C are views showing the processes in which the p-type clad layer 58 and the contact layer 59 are formed by the temperature-difference LPE process. FIG. 6 is a sectional view showing equipment with which the temperature-difference LPE process is performed. In this equipment, a core tube 72 which is made of quartz and which allows reducing hydrogen to flow internally is disposed inside a cylindrical heater 71. In this core tube 72 are accommodated a substrate supporting base 74 made of graphite and a slide board 75 attached to this substrate supporting base 74 so as to be slidable in the axial direction. Between the heater 71 and the core tube 72 and below the substrate supporting base 74, a plurality of cooling tube 77, 77, . . . which allow a cooling medium to flow along the axis of the substrate supporting base 74 are disposed so as to be circumferentially arrayed. By setting the flow rate of the cooling medium to flow through the plurality of cooling tubes 77, 77, . . . , the temperature of the substrate supporting base 74 can be controlled. As a result of this, there arises a temperature difference between the slide board 75 and the substrate supporting base 74. Further, respective flow rates of the cooling medium to be put into flow through the plurality of cooling tubes 77, 77, . . . can be controlled to control the widthwise temperature distribution of the substrate supporting base 74.

As shown in FIG. 5A, first, the substrate 51 with the layers up to the current constriction layer 56 stacked thereon and with the striped groove 64 made therein as shown in FIG. 4B is set to a recess 74a of the substrate supporting base 74. Also, a clad-layer growth solution 82 and a contact-layer growth solution 83 are set to two recesses 75a, 75b formed in the slide board 75, respectively, and material crystals 82a, 83a are set to the clad-layer growth solution 82 and the contact-layer growth solution 83, respectively. Specified doping elements have been added to the clad-layer growth solution 82 and the contact-layer growth solution 83, respectively. In this state, the substrate supporting base 74 and the slide board 75 are heated for a specified time by the heater 71, by which solutions of uniform liquid composition are generated in the recesses 75a, 75b. Thereafter, as shown in FIG. 5B, the slide board 75 is moved axially with an operating rod 85 connected to the slide board 75 so that the recess 75a of the slide board 75 is positioned onto the recess 74a of the substrate supporting base 74 having the substrate 51 accommodated therein, where the solution in the recess 75a of the slide board 75 is kept in contact on the substrate 51 for a specified time. In this way, p-$Al_{0.5}Ga_{0.5}As$ is epitaxially grown within the striped groove 64 on the lower-side p-type clad layer 55 on the substrate 51 and on the current constriction layer 56, by which the upper-side p-type clad layer 58 is formed. Subsequently, as shown in FIG. 5C, the slide board 75 is further moved axially with the operating rod 85 so that the recess 75b of the slide board 75 is positioned onto the recess 74a of the substrate supporting base 74, where the solution in the recess 75b of the slide board 75 is kept in contact on the substrate 51 for a specified time. In this way, p-GaAs is epitaxially grown on the upper-side p-type clad layer 58 on the substrate 51, by which the contact layer 59 is formed. Thereafter, the slide board 75 is further moved axially so as to be removed from on the recess 74a of the substrate supporting base 74, and the substrate 51 with the upper-side p-type clad layer 58 and the contact layer 59 formed therein is taken out.

With the use of the temperature-difference LPE process, a temperature difference is generated between the slide board 75 and the substrate supporting base 74, so that the substrate 51 in the recess 74a of the substrate supporting base 74 is kept lower in temperature than the solutions in the recesses 75a, 75b of the slide board 75, thus allowing epitaxial growth to be implemented on the substrate 51 by virtue of the temperature difference. Accordingly, unlike the slow cooling LPE process, in which epitaxial growth is implemented by lowering the temperature of the substrate and the solutions after contact of the solutions with the substrate, there occur no decreases in the amount of dopant deposition along the direction of growth of the growth layers due to temperature decreases. As a result, the contact layer 59 grown by the temperature-difference LPE process can be made generally uniform in the amount of dopant deposition thicknesswise, so that a carrier concentration uniform in the thicknesswise direction can be obtained.

Figure 7:
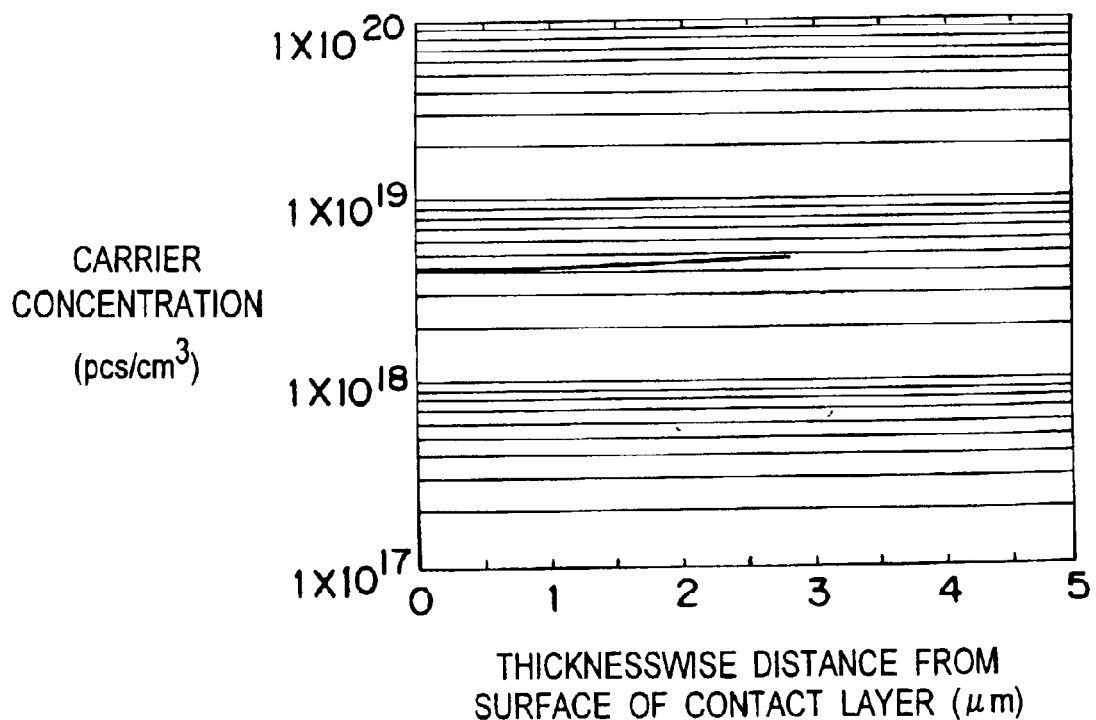
FIG. 7 is a chart showing thicknesswise carrier distribution of the contact layer formed by the temperature-difference LPE process.
Figure 8:
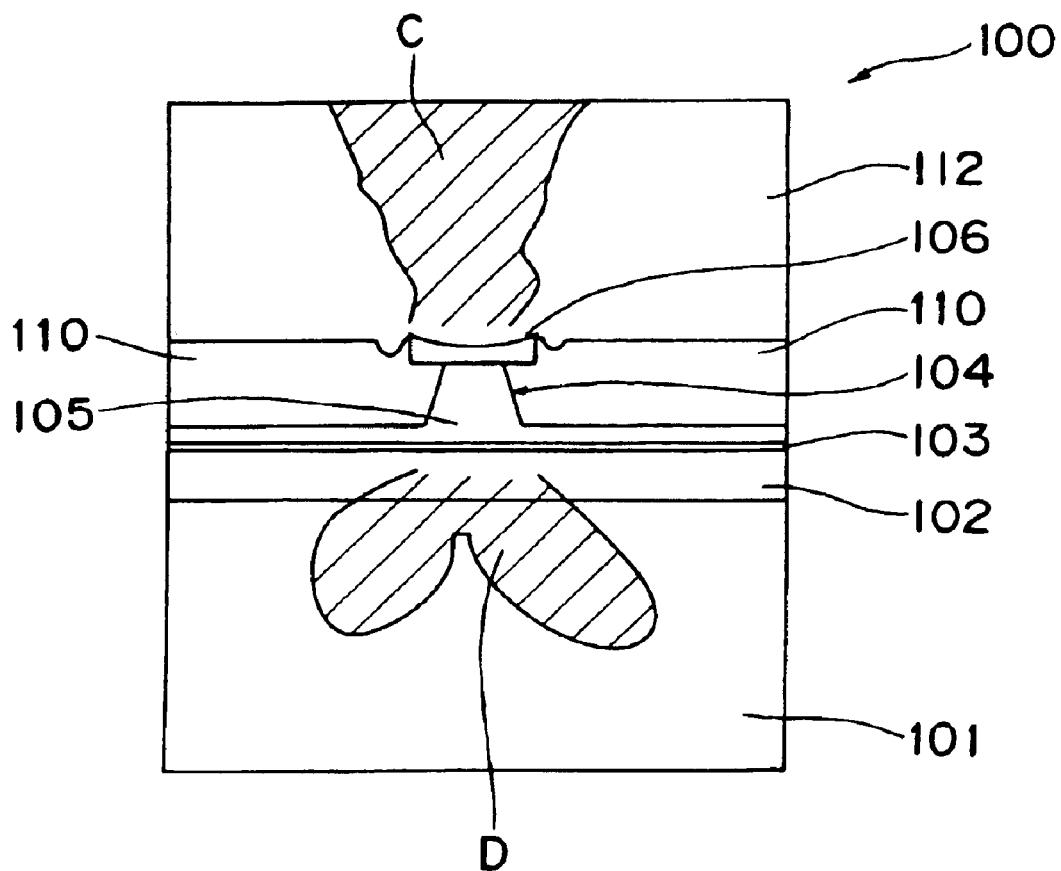
FIG. 8 is a view showing a semiconductor laser device according to a prior art.
Figure 9A:
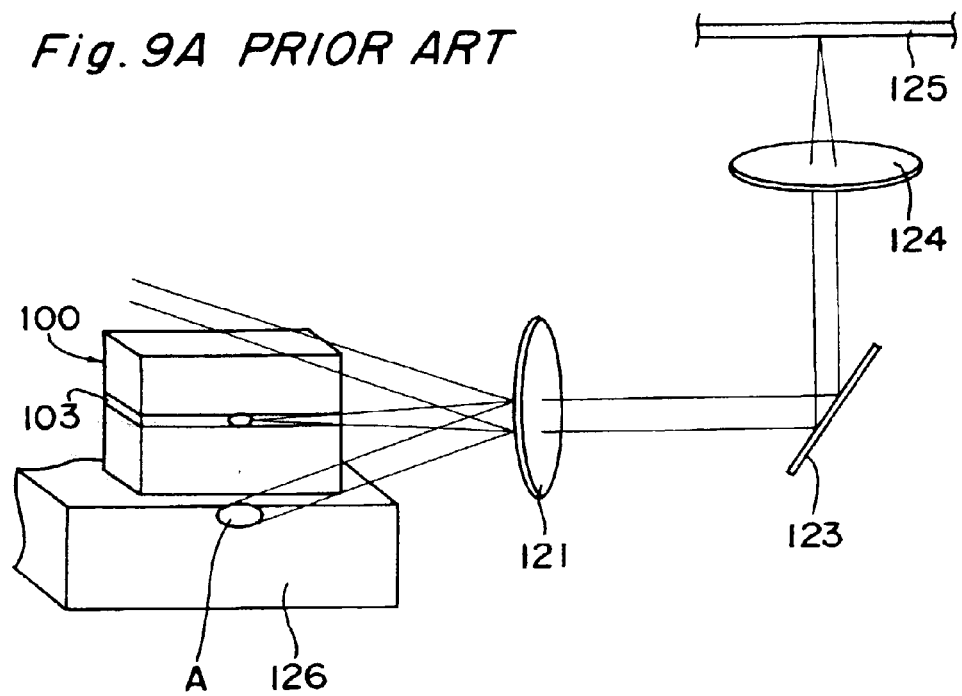
FIG. 9A is a view showing a state in which with a semiconductor laser device applied to an optical pickup of an optical disk system, a return beam comes incident only on an end face of a stem on which the semiconductor laser device is mounted.
Figure 9B:
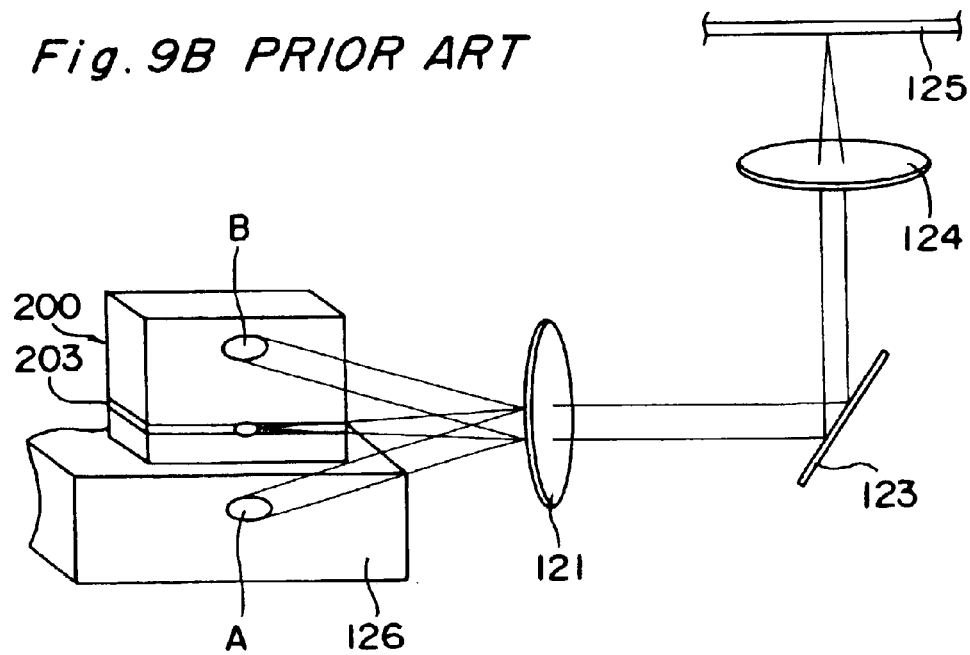
FIG. 9B is a view showing a state in which a return beam comes incident on an end face of a semiconductor laser device applied to an optical pickup of the optical disk system.
Figure 10A:
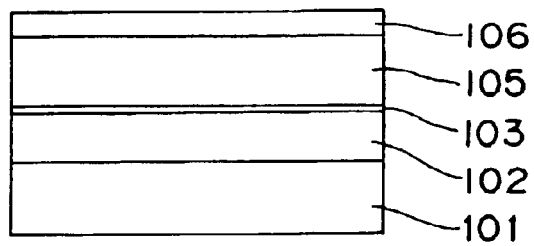
FIGS. 10A, 10B, 10C and 10D are views showing the steps of manufacturing the prior-art semiconductor laser device in sequence.
Figure 10B:
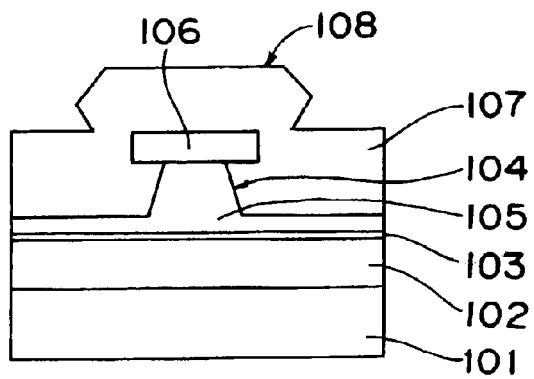
Figure 10C:
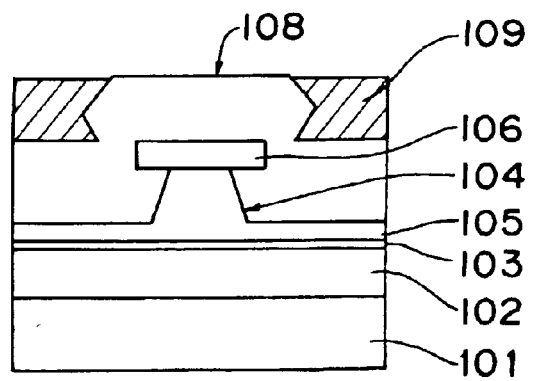
Figure 10D:
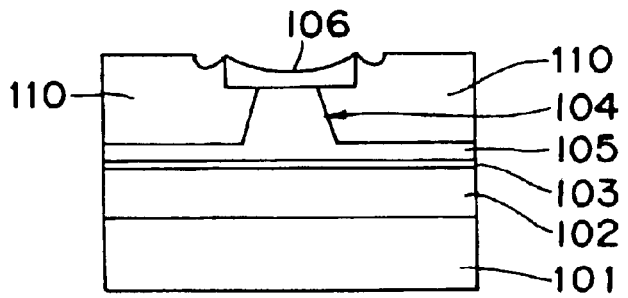
Figure 11:
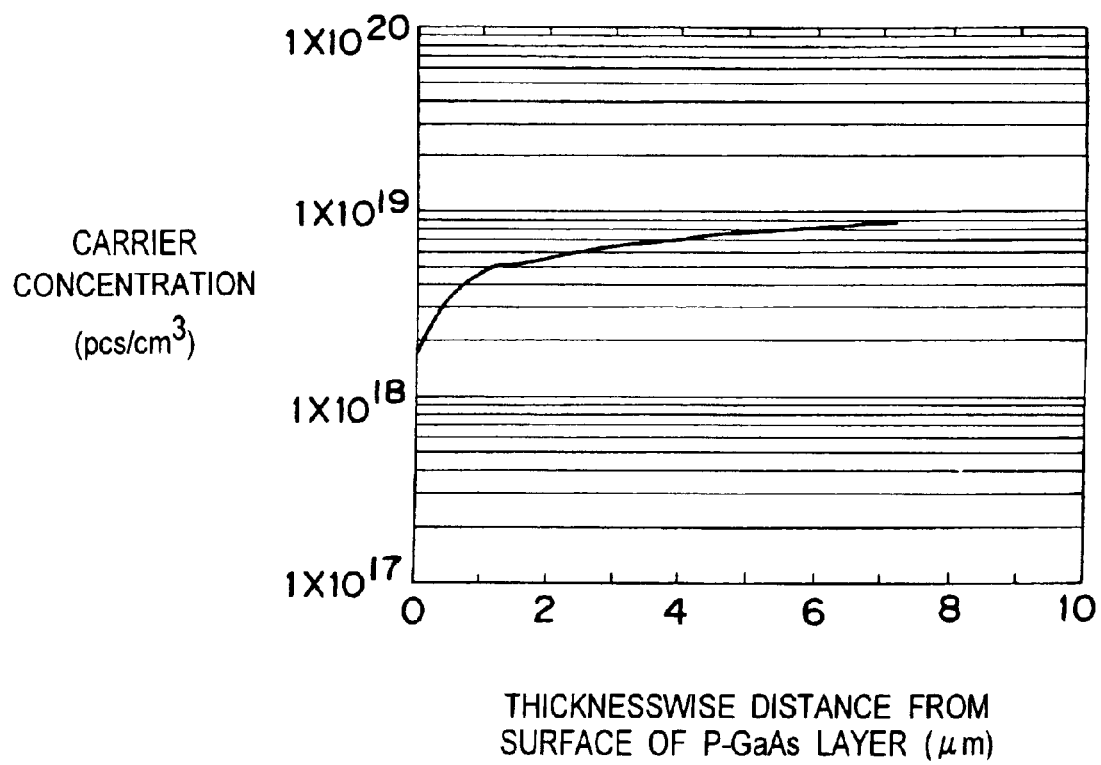
FIG. 11 is a chart showing thicknesswise carrier distribution of a p-GaAs layer formed by slow cooling LPE process.
Figure 12A:
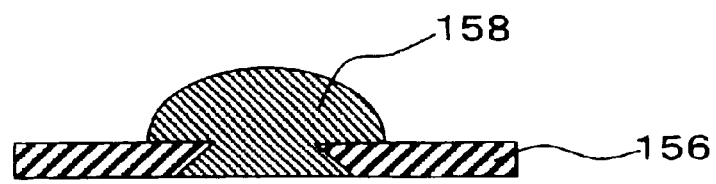
FIGS. 12A, 12B and 12C are views showing changes in the filled state of a groove of a current constriction layer depending on the magnitude of supersaturation Δt of LPE growth solution in the case where the groove of the current constriction layer is filled by slow cooling LPE process.
Figure 12B:
Figure 12C:
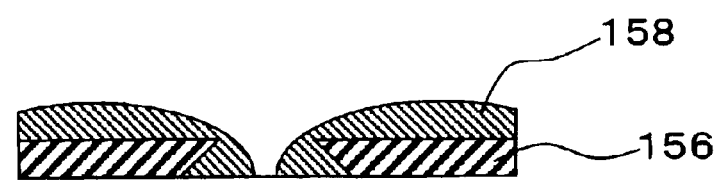

FIG. 7 is a chart showing thicknesswise carrier distribution of the contact layer 59 formed by the temperature-difference LPE process. In FIG. 7, the horizontal axis represents the thicknesswise distance ($\mu$m) from the upper end of the contact layer 59, and the vertical axis represents the carrier concentration (pcs/cm$^3$). As shown in FIG. 7, this contact layer 59 shows almost no changes in carrier concentration along the thicknesswise direction, hence a generally uniform carrier concentration. Accordingly, it is no longer necessary to eliminate an upper end portion of a growth layer in the process of forming the contact layer, which would be involved in the prior art, so that manufacturing labor and cost for the semiconductor laser device can be reduced.

Furthermore, with the temperature-difference LPE process, since the temperature difference control can be implemented not only in the lengthwise direction of the substrate supporting base 74 but also in the widthwise position thereof, the temperature difference can be changed within the wafer surface during the process of forming the upper-side p-type clad layer 58. That is, the crystal-filled state into the striped groove 64 can be controlled within the wafer surface. As a result, growth defects at the groove part, which would often occur with the slow cooling LPE process, can be avoided, so that an upper-side p-type clad layer 58 almost free from depressions and projections at the surface can be formed.

The contact layer 59 in the above embodiment may be formed to any thickness within a range of 10 to 60 $\mu$m. In short, the requirement is only that the thickness from the active layer to the lower surface of the substrate and the thickness from the active layer to the upper surface of the contact layer are made generally equal to each other, where the active layer is positioned at a thicknesswise generally center of the semiconductor laser device. As a result, when this semiconductor laser device is used as a light source of an optical pickup, incidence of the return beam from the optical disk to the semiconductor laser device can be reduced effectively. Thus, the S/N ratio of signals to be read by the optical pickup can be improved effectively.

As apparent from the foregoing description, according to a semiconductor laser device of the present invention, the semiconductor laser device comprises, on a semiconductor substrate, a first clad layer, an active layer, a second clad layer having a ridge portion, a current constriction layer positioned on the second clad layer and on both sides of the ridge portion, and a contact layer, where the contact layer is formed by vapor phase epitaxial process, the semiconductor laser device further comprising a strain-occurrence preventing structure for preventing any strain from occurring in the contact layer. Thus, since occurrence of strain in the contact layer is prevented, deteriorations in the light-emitting characteristics of the semiconductor laser device due to strain of the contact layer, as would occur in the prior art, can be prevented so that a semiconductor laser device having successful light-emitting characteristics is obtained.

According to a semiconductor laser device manufacturing method of the invention, the semiconductor laser device manufacturing method comprises the steps of: forming a first clad layer, an active layer, a second clad layer one on another on a semiconductor substrate; forming a ridge portion in the second clad layer; forming a current constriction layer on the second clad layer and on both sides of the ridge portion; forming a flattening layer on the ridge portion of the second clad layer and on the current constriction layer by LPE process; and forming a contact layer on the flattening layer by vapor phase epitaxial process. Therefore, the contact layer can be formed without causing strain. As a result, a semiconductor laser device having successful light-emitting characteristics can be obtained.

According to a semiconductor laser device of the invention, the semiconductor laser device comprises, on a semiconductor substrate, a first clad layer, an active layer, a lower-side second clad layer, current constriction layers positioned on both sides of the lower-side second clad layer, an upper-side second clad layer positioned on the lower-side second clad layer and the current constriction layer, and a contact layer, wherein the upper-side second clad layer is formed by temperature-difference LPE process. Since this temperature-difference LPE process is capable of controlling the growth temperature so that temperatures at the surfaces of the lower-side second clad layer and the current constriction layer are made different from each other, crystals constituting the upper-side second clad layer can be properly grown and filled therein by properly controlling the growth temperature for the part between the current constriction layers. As a result, crystal growth defects or the like between the current constriction layers can be prevented effectively, so that the yield of the semiconductor laser device can be improved effectively and moreover that a semiconductor laser device having successful characteristics can be obtained.

According to a semiconductor laser device manufacturing method of the invention, the semiconductor laser device manufacturing method comprises the steps of: forming a first clad layer, an active layer, a lower-side second clad layer and a current constriction layer on a semiconductor substrate; forming a striped groove in the current constriction layer; forming an upper-side second clad layer on the lower-side second clad layer and on the current constriction layer by temperature-difference liquid phase epitaxial process; and forming a contact layer on the upper-side second clad layer by temperature-difference liquid phase epitaxial process. Therefore, the upper-side second clad layer can be formed by the striped groove being filled without causing depressions and projections on the striped groove of the current constriction layer, and moreover the carrier concentration of the contact layer can be formed generally uniform in the thicknesswise direction. Thus, a semiconductor laser device having successful light-emitting characteristics can be obtained stably. Besides, since the upper-side second clad layer is formed by temperature-difference LPE process, crystal growth defects within the striped groove of the current constriction layer can be prevented effectively. As a result, the semiconductor laser device having successful light-emitting characteristics can be manufactured with a successful yield.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
a semiconductor substrate, and a first clad layer, an active layer, a second clad layer having a ridge portion, a current constriction layer positioned on the second clad layer and on both sides of the ridge portion, a contact layer formed by a vapor phase epitaxial process and a flattening layer formed by a liquid-phase epitaxial process between the current constriction layer and the ridge portion of the second clad layer and the contact layer.

2. The semiconductor laser device according to claim 1, wherein the ridge portion of the second clad layer has a height of 1.2 $\mu$m or more.

3. The semiconductor laser device according to claim 1, wherein the flattening layer is a flattening layer formed by a temperature-difference liquid phase epitaxial process.

4. A method for manufacturing a semiconductor laser device, comprising:

forming on a semiconductor substrate a first clad layer, an active layer, a second clad layer one on another in that order;

forming a ridge portion in the second clad layer;

forming a current constriction layer on the second clad layer and on both sides of the ridge portion;

forming a flattening layer on the ridge portion of the second clad layer and on the current constriction layer by a liquid phase epitaxial process; and forming a contact layer on the flattening layer by a vapor phase epitaxial process.

5. The method for manufacturing a semiconductor laser device according to claim 4, wherein the flattening layer is formed at a temperature lower than any one of the temperatures for forming the first clad layer, the active layer, the second clad layer and the current constriction layer.

6. A method for manufacturing a semiconductor laser device, comprising:

forming a first clad layer, an active layer, a lower-side second clad layer and a current constriction layer on a semiconductor substrate;

forming a striped groove in the current constriction layer;

forming an upper-side second clad layer on the lower-side second clad layer and on the current constriction layer by a temperature-difference liquid phase epitaxial process; and forming a contact layer on the upper-side second clad layer by a temperature-difference liquid phaseepitaxial process.

* * * * *